United States Patent [19]

Trinh et al.

[11] Patent Number: 6,081,416
[45] Date of Patent: Jun. 27, 2000

[54] LEAD FRAMES FOR MOUNTING CERAMIC ELECTRONIC PARTS, PARTICULARLY CERAMIC CAPACITORS, WHERE THE COEFFICIENT OF THERMAL EXPANSION OF THE LEAD FRAME IS LESS THAN THAT OF THE CERAMIC

[76] Inventors: Hung Trinh, 10941 Caminito Arcada, San Diego, Calif. 92131; Alan D. Devoe, 5715 Waverly, La Jolla, Calif. 92037; Daniel Devoe, 1106 Barcelona, Pt. Loma, Calif. 92107

[21] Appl. No.: 09/087,209

[22] Filed: May 28, 1998

[51] Int. Cl.[7] .................................................. H01G 2/20
[52] U.S. Cl. ..................... 361/308.1; 361/813; 361/321.2
[58] Field of Search .............................. 361/306.1, 306.2, 361/306.3, 308.1, 320, 321.1–321.5, 760–761, 763, 766, 773, 782, 811, 813; 174/52.4; 333/184–185; 338/315–316, 322, 332, 328

[56] References Cited

U.S. PATENT DOCUMENTS

| | | | |
|---|---|---|---|
| 3,946,290 | 3/1976 | Yoshioka et al. | 361/306.1 |
| 4,151,579 | 4/1979 | Stark | 361/308.1 |
| 4,594,641 | 6/1986 | Hernandez | 361/306.1 |
| 4,630,170 | 12/1986 | Kask et al. | 361/306.1 |

*Primary Examiner*—Kristine Kincaid
*Assistant Examiner*—Anthony Dinkins
*Attorney, Agent, or Firm*—Fuess & Davidenas

[57] ABSTRACT

A ceramic electrical device or component, normally a barium titanate ceramic capacitor, having a first coefficient of thermal expansion (CTE), typically about 10 parts per million per degree centigrade (10 ppm/°C.), is physically and electrically mounted through an intermediary solder layer, normally copper, to a lead frame, normally made from a selected alloy of nickel-iron, having a second CTE at least one-fifth (20%) less, and more typically about 5 ppm/°C., or one-half (50%) less, than is the CTE of the ceramic capacitor. Because ceramics are stronger in compression than in tension, the ceramic capacitor held within the lead frame is less likely to undergo a stress fracture at temperatures elevated above those of assembly than would be the case should the CTE's be equal, or should the CTE of the lead frame be greater than the CTE of the ceramic capacitor. Leaded ceramic capacitors, stacked multilayer ceramic capacitors, ceramic inductors and ceramic resistors so constructed satisfy United States standards for electronic components used in broad-temperature-range demanding military and space applications.

18 Claims, 2 Drawing Sheets

TYPICAL THERMAL EXPANSION DATA

Linear Coefficient of Thermal Expansion
cm. per cm. per °C x 10$^{-6}$

| Temperature range - °C | Class 1 Kovar | Class 2 Alloy 52 | Class 3 Alloy 48 | Material Class 4 Alloy 46 | Class 5 Alloy 42 | Class 6 Alloy 42-6 | Class 7 Invar |
|---|---|---|---|---|---|---|---|
| 30-100 | — | 10.5 | 9.4 | 8.2 | 4.8 | — | .8 - 1.6 |
| 30-150 | — | 10.5 | 9.4 | 8.1 | 4.6 | — | — |
| 30-200 | 5.5 | 10.4 | 9.4 | 7.9 | 4.5 | — | 13 - 21 |
| 30-250 | — | 10.4 | 9.3 | 7.8 | 4.5 | — | — |
| 30-300 | 5.1 | 10.2 | 8.8 | 7.5 | 4.0-4.7 | 8.2 | 4.92 |

Figure 5
PRIOR ART

LEAD FRAMES FOR MOUNTING CERAMIC ELECTRONIC PARTS, PARTICULARLY CERAMIC CAPACITORS, WHERE THE COEFFICIENT OF THERMAL EXPANSION OF THE LEAD FRAME IS LESS THAN THAT OF THE CERAMIC

BACKGROUND OF THE INVENTION

1. Field of the Invention

The present invention generally concerns the affixation of lead frames, and leads, to ceramic electrical components, particularly including ceramic capacitors.

The present invention particularly concerns ceramic capacitors having predetermined coefficient of thermal expansion, and lead frames for these ceramic capacitors which lead frames also have a predetermined coefficient of thermal expansion.

2. Description of the Prior Art

2.1 Coefficients of Thermal Expansion

It is known to match the coefficients of expansion in different materials used in a ceramic electronic components, including ceramic capacitors, and in the electrodes, leads and/or lead frames of the ceramic electronic components.

For example, U.S. Pat. No. 3,946,290 to Yoshioka, et. al. for a HIGH TENSION CERAMIC CONDENSER, assigned to TDK Electronics Co. Ltd. (Tokyo, JA) concerns an improved high voltage ceramic capacitor which includes a ceramic body having electrode layers formed on opposite sides thereof. Novel terminals—formed of material having a coefficient of expansion which is the same as, or nearly the same as, the material of the ceramic body—are bonded to the electrode.

Further by way of example, U.S. Pat. No. 4,279,785 to Stewart, et. al., for GLASS ENCAPSULATION OF SEMI-CONDUCTOR DEVICES, assigned to ITT Industries, Inc. (New York, N.Y.), concerns a low melting point glass for semiconductor device encapsulation. The glass is based on the lead oxide/phosphorus pentoxide/vanadium pentoxide system and has a thermal coefficient of expansion similar to that of a copper alloy lead frame. The glass is applied to a device as a frit which is then heat fused.

Rarely, materials having different thermal coefficients of expansion have been combined in electronic components.

For example, U.S. Pat. No. 4,065,636 to Herczog for a HERMETIC ENCLOSURE FOR ELECTRONIC COMPONENT, assigned to Corning Glass Works (Corning, N.Y.), concerns a hermetic enclosure for an electrical component, particularly for a tantalum capacitor, and a method of forming it. A silver container is provided having an open end at which an outwardly protruding flange is formed. A quantity of sealing glass is sealed to a lead and formed into a bead about the lead intermediate the ends thereof. A metallic collar having an outwardly protruding flange is disposed about the bead. This assembly and a metallic band, having a temperature coefficient of expansion greater than the glass bead, is heated and the metallic band is disposed about the collar so as to place the collar and glass bead in compression upon cooling thereby effecting a compression seal between the collar and the glass bead. A hermetic seal is then effected between the outwardly protruding flange of the container and the outwardly protruding flange of the collar.

At the same time, it is known to attempt to compensate for, avoid, and/or mitigate such stress-related damage as may occur from the mounting and mating of electronic components having materials with different coefficients of expansion.

For example, U.S. Pat. No. 4,151,579 to Stark for a CHIP CAPACITOR DEVICE, assigned to AVX Corporation (Great Neck, N.Y.), is directed to a capacitor device and method of forming same, and more particularly to a monolithic ceramic capacitor incorporating an improved conductive termination arrangement providing a compliant connector for mechanically and electrically connecting the capacitor to a substrate, said termination arrangement providing increased resistance to damage to the capacitor as a result of differential coefficient of expansion between the capacitor and the substrate on which it is mounted.

It is also known that multiple electrical connections can be made in the various areas of a single lead frame, and that the lead frame itself, exhibiting as it does electrical reactance, may be engineered as part of the circuit in which the electronic component carried by the lead frame is used.

For example, U.S. Pat. No. 4,454,529 to Philofsky, et. al., for an INTEGRATED CIRCUIT DEVICE HAVING INTERNAL DAMPENING FOR A PLURALITY OF POWER SUPPLIES, assigned to AVX Corporation (Great Neck, N.Y.), is directed to an integrated circuit device comprising a lead frame having a ceramic capacitor mounted thereon and forming the support for a silicon chip bearing a large number of circuits, including at least two power supply circuits; namely, a main power supply circuit and a secondary circuit. The capacitor is shunted across the terminals of the main power supply and the main power terminals of the IC chip. A conductive layer disposed atop the ceramic uppermost layer of the capacitor defines, along with the uppermost electrode of the capacitor, a second capacitive load of lesser value than is the main capacitor, this second capacitive load being shunted across the terminals of the secondary power supply and a secondary set of power terminals of the chip. The provision of internal capacitive shunting for the several power supplies for the chip enables lead length to the capacitors to be maintained at a minimum, thereby minimizing inductive reactance and thus enabling small capacitances to effectively dampen noise and pulses in the circuit.

The geometries of the lead frames, and the electrical components that it serves to support and to connect, can be quite complex.

For example, U.S. Pat. No. 4,594,641 to Hernandez for a DECOUPLING CAPACITOR AND METHOD OF FORMATION THEREOF, assigned to Rogers Corporation (Rogers, Conn.), presents a decoupling capacitor including a pair of conductors, each having a lead connected thereto formed from a continuous strip of electrically conductive material (lead frame), the strip having opposing planar surfaces. A pair of dummy leads, each being associated with a conductor, but isolated therefrom, is also formed from the strip. Thereafter, a strip of first insulating material is positioned across from one opposing surface of the conductive strip and a strip of second insulating material having a plurality of openings or windows therein is positioned on the other opposing surface of the conductive strip. The two insulating layers sandwiching the conductive strip are then heat tacked and hot press laminated to form a continuous strip of laminated material. The windows are positioned on the conductive strip to define access opening for the two conductors. Next, drops of solder paste are deposited on each conductor through the windows whereupon a multi-layer monolithic ceramic capacitor is placed through each window, between the two conductors and in contact with the solder paste. The multi-layer capacitor includes first and second conductive end surfaces which are electrically and mechanically bonded respectively to each conductor via the solder (after a reflow process). The multi-layer capacitor is then encapsulated and sealed by placing encapsulant material (i.e., epoxy, silicon, etc.) in the space defined by the window. Finally, the now sealed, laminated and encapsulated decoupling capacitor is severed from the lead frame. The decoupling capacitor thus formed is both hermetically sealed and automatically insertable for use in conjunction with integrated circuit DIP inserter devices.

Similarly, U.S. Pat. No. 4,630,170 to Kask, deceased, et. al., for a DECOUPLING CAPACITOR AND METHOD OF MANUFACTURE THEREOF, assigned to Rogers Corporation (Rogers, Conn.), concerns a decoupling capacitor and method of manufacture thereof wherein the decoupling capacitor is formed from a lead frame which contains the four leads of the capacitor (two of which are electrically inactive) on a single plane. The use of a lead frame automatically provides the dimensional tolerances necessary for encapsulation molding of the decoupling capacitor. The decoupling capacitor is a hermetically sealed capacitive unit consisting of a single layer ceramic capacitor, active leads bonded to the capacitor and dummy pins for auto-insertion into printed circuit boards.

Still further, U.S. Pat. No. 4,832,612 to Grabbe, et. al., for a PROTECTIVE CARRIER AND SECURING MEANS THEREFOR, assigned to AMP Incorporated (Harrisburg, Pa.), concerns a protective carrier having a flexible circuit attached thereto, the protective carrier protecting the circuit during transportation and handling thereof. The flexible circuit is attached to the protective carrier in such a manner as to ensure proper registration and to maintain the center of all components in coincidence as dimensional change occurs due to the different temperature coefficient of expansion of each component. The protective carrier can be used to orient, position, and install an integrated circuit chip carrier and lead frame on an interposer socket. As the lead frame has a large number of contact zones positioned thereon, contact force is required between the interposer socket and the lead frame. Thus, a pressure plate is provided to cooperate with posts and the protective carrier to provide the force required to ensure that a positive electrical connection is effected between the contact zones and the contacts of the interposer socket.

2.2 Miscellaneous Data on Materials: Ceramic, and Metals Including Phosphor Bronzes, Cupro Nickels and Nickel Silvers, and Nickel Iron It will be seen that the present invention depends on the properties of materials, particularly the coefficient of thermal expansion (CTE) properties of materials.

In this regard, and as background to the present invention, it should be known that ceramic—whether of the barium titanate or the ferrite type, or even the alumina type or still other types—commonly has a coefficient of thermal expansion of about 10 parts per million per degree Centigrade (10 ppm/°C.).

As further background to the present invention, it should be known that different metals, and metal allows, have differing coefficients of thermal expansion. For example, and among the metals and metal alloys commonly used for electrically connecting electronic components, the phosphor bronzes—which commonly contain from about 91.9% to 94.9% copper (Cu), 5% to 8% tin (Sn) and 0.1% phosphorus (P)—have coefficients of thermal expansion that are about 9.9–10.1 ppm/°C. For example, the cupro nickels and nickel silvers—which commonly contain from about 55% to 72% copper (Cu), 9.5% to 30% zinc (Zn) and 0.6% to 18% iron (fe), tin (Sn) or nickel (Ni)—have coefficients of thermal expansion that are about 9.0–9.3 ppm/°C. Finally, nickel iron—which is commonly about 42% nickel (Ni), 0.02% carbon (C), 0.6% manganese (Mn) with the balance iron (Fe)—has a coefficient of thermal expansion as low as 2.3 ppm/°C., and most commonly <5 ppm/°C. for all alloys so called.

Clearly it is nickel iron, only (among common metals used in electrically connecting electronic components), that has a coefficient of thermal expansion less than ceramic. This property will be seen to be used to good effect in the present invention. Indeed, this family of alloys is called "low expansion alloys" by Ed Fagan, Inc., a leading U.S. supplier of industrial metals.

Further in background to the nickel-iron alloy family, it should be known that this family generally includes INVAR and KOVAR alloys; alloys 42, 46, 48, and 52; alloy 42-6; and magnetic shielding alloys such as MuMetal. The KOVAR alloys are UNS nos. K94610, K94620 and ASTM nos. F-15, F-1466. The 52 alloy is UNS no. K14052 and ASTM no. F-30. The 48 alloy is UNS no. K94800 and ASTM no. F-30. The 46 alloy is UNS no. K94600 and ASTM no. F-30. The 42 alloy is UNS no. K94100 and ASTM no. F-30. The 48-6 alloy is UNS no. K94760 and ASTM no. F-31. Finally, INVAR 36 alloys are UNS nos. K93601, K93602 and ASTM nos. F-658, B-753. There exist additional (U.S.) military specifications for these alloys; MIL 123011C Classes 1–7.

In general, the nickel-iron group of alloys is not hardenable by heat treatment. They can be made harder through cold working only. The annealed hardness for these alloys is generally in the range of RB 70/80, whereas the ¼ H to ½ H range for this group of metals can run between RB 80/96.

Although the present invention is not concerned with the machining of nickel-iron alloys, a few words on the machining of this material are relevant insofar as they tend to show the pronounced effects of (i) oxide creation (albeit not the effect of such oxide on electrical conductivity), and, separately, (ii) heat buildup (albeit not from the environment, but instead from machining). The present invention takes both these properties into account, although not in the context of machining.

Nickel-iron material in the annealed condition is more difficult to machine because it is soft and gummy; tools tending to plow the metal instead of cuffing into it, with chips not easily formed. Surface scale oxide is tightly adherent and penetrates the surface to a greater extent than stainless steels. Machining is considerably improved by descaling the material. If there were standard machinability ratings applied for this series of alloys, alloy AlSi-B-1112 being measured as 100%, the following percentages could be suggested for these chemistries: INVAR FM 60%; (KOVAR) ASTM-F15 40%; and Alloy 48 40%.

It will be seen that the present invention is believed to offer a beneficial effect during soldering. A remote suggestion that the nickel iron alloys might induce stresses in anything with which, and to which, they are mechanically fixed during heating and/or the presence of heat—such as during soldering—is presented by the fact that it is known to control heat buildup in nickel iron alloys during machining. Heat buildup is the major cause of warpage. Suggested coolants are Keycoot 2000 or Prime Cut. (Whatever lubricant is used for machining, it should not contain sulphur. Sulphur can effect the performance of many sealed electronic parts.) Although not integral to the present invention, the present invention will be seen to make beneficial use of any induced stresses that may arise upon the soldering of nickel iron alloys (if any such stresses do arise, which seems likely).

SUMMARY OF THE INVENTION

The present invention contemplates a leaded ceramic electrical device or component, normally a leaded ceramic capacitor, held within, and electrically connected by, a lead frame where the ceramic of the capacitor has a coefficient of thermal expansion ("CTE") that is at least one-quarter (25%) greater than the thermal coefficient of expansion of the lead frame (i.e., equal to or greater than 125% of the CTE of the lead frame). Equivalently, and alternatively, it may be stated that the lead frame has a coefficient of thermal expansion (CTE) that is at least one-fifth (20%) less than the thermal coefficient of expansion of the capacitor (i.e., the CTE of the lead frame is equal to or less than 80% of the CTE of the capacitor).

In mathematical terms where $CTE_{lf}$ is the coefficient of thermal expansion of a lead frame, and $CTE_c$ is the coefficient of thermal expansion of a electronic component, normally a capacitor, that is carried on the lead frame:

$$CTE_{lf} \leq 0.80\ CTE_c$$

or $$CTE_c \geq 1.25\ CTE_{lf}$$

The ceramic capacitor is normally made of barium titanate ceramic, or, more commonly, any ceramic having a coefficient of thermal expansion of about 10 parts per million per degree Centigrade (10 ppm/°C.). The ceramic capacitor has and presents conductive surfaces, and is preferably physically and electrically affixed by soldering these surfaces to the lead frame through an intermediary solder layer, normally copper, upon the lead frame.

The lead frame is normally made of an alloy of nickel-iron having a coefficient of thermal expansion of, preferably, about 5 parts per million per degree Centigrade (5 ppm/°C.). It is further, optionally, preferably pre-coated with a solderable surface made from the group of metals consisting essentially of cooper, nickel, gold, silver and combinations and alloys thereof—although this is not essential to the invention.

Clearly the coefficient of thermal expansion (CTE) of the preferred lead frame is less than the CTE of the ceramic. It is at least one-fifth (20%) less (i.e., ≦80% of the CTE of the ceramic), and is, for the preferred materials, a full one-half (50%) less (i.e., =50% of the CTE of the ceramic). Equivalently, it may be stated that the CTE of the ceramic is greater than that of the lead frame. It is at least one quarter more (i.e., ≧125% of the CTE of the lead frame), and is, for the preferred materials, twice more (i.e., =200% of the CTE of the lead frame).

The reason for this relationship is as follows: Because ceramics are stronger in compression than in tension, the ceramic capacitor is less likely to undergo a stress fracture at temperatures elevated above those of assembly than would be the case should the coefficients of thermal expansion be equal, or should the coefficient of thermal expansion of the lead frame be greater than that of the ceramic capacitor. Leaded ceramic capacitors, inductors and resistors so constructed satisfy United States standards for electronic components used in military and space applications.

Further in accordance with the present invention a number of ceramic capacitors, and more typically two to six multilayer ceramic capacitors, are stacked, and are both connected in electrical parallel and collectively mounted, by a lead frame. The capacitors as held in a stack by the lead frame are preferably separated by a (i) ceramic spacer, and (ii) a glass encapsulant serving as an adhesive. Capacitors so constructed maintain good mechanical integrity, helping promote that the lead frame, which is attached with high temperature solder, should not be subject to such stresses as might lead to displacement and/or dislodging when the stacked capacitor is reflow soldered onto a printed circuit board. In other words, stacked capacitors in accordance with the present invention are physically robust, including during assembly into circuits, as well as being thermally robust in the face of extreme thermal variations at times after assembly.

These and other aspects and attributes of the present invention will become increasingly clear upon reference to the following drawings and accompanying specification.

BRIEF DESCRIPTION OF THE DRAWINGS

FIG. 5 is a prior art table of the typical linear coefficient of thermal expansion for the common nickel-iron alloys, and from this table certain alloys suitable to the purposes of the present invention for various temperature ranges may readily be located.

DESCRIPTION OF THE PREFERRED EMBODIMENT

Leaded stacked capacitors are made by stacking typically from 1 to 6, and sometimes more, multilayer ceramic capacitors (MLC). Electrical connection between the capacitors in the stack is made by soldering metal lead frames on the two ends. This puts all the capacitors in parallel, so the capacitance of the stack is the sum of the capacitance of all the MLC's.

Figure 1A:
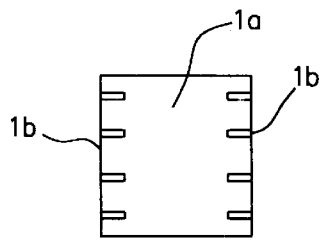
FIGS. 1a and 1b, are diagrammatic perspective views of stacked ceramic capacitors held in lead frames.
Figure 1B:
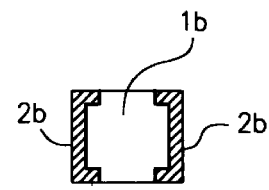

Diagrammatic perspective views of stacked ceramic capacitors 1a, 1b, each held in a respective lead frame 2a, 2b are shown in FIGS. 1a and 1b.

The lead frames 2a, 2b serve to mechanically and electrically (parallel) connect the stacked MLC's, and also to permit of the convenient common mounting of, and electrical connection to, the stack. Such is the function of a lead frame, which is defined as "a metal structure that is part of an electrical or an electronic device". The die is attached to the lead frame. An engineer familiar with the packaging of electronic components will also realize that a lead frame is related to leads. Namely, leads, or legs, are the "feet" of an electronic component. Especially when the component is an IC, the leads are often called pins. The lead is the portion of the lead assembly that is formed after a portion of the lead frame is cut away. A lead is the component's connection to the outside world.

The lead frames 2a, 2b serve to absorb mechanical stresses due to shock and vibration and, as is of importance to the present invention, thermal stresses do due non-uniform expansion and contraction of the various parts and sections of the stacked ceramic capacitors 1a, 1b. Thermal stress may occur during mounting and electrical connection of the stacked ceramic capacitors 1a, 1b by, commonly, reflow soldering of their leads, or feet, as are part of the lead frames 2a, 2b. Stresses will occur even should the entire stacked ceramic capacitors 1a, 1b, including its lead frames 2a, 2b, have no difference in coefficient of thermal expansion (CTE), nor any regional differences in temperature (both of which are clearly impossibilities). This is because there will be an inevitable coefficient of thermal expansion (CTE) mismatch between the circuit board and the MLC stacked ceramic capacitors 1a, 1b. During reflow soldering the circuit board will typically expand and contact more than the ceramic capacitors 1a, 1b. This produces stresses that could crack the capacitors 1a, 1b if there were no lead frames 2a, 2b interposed.

Figure 2:
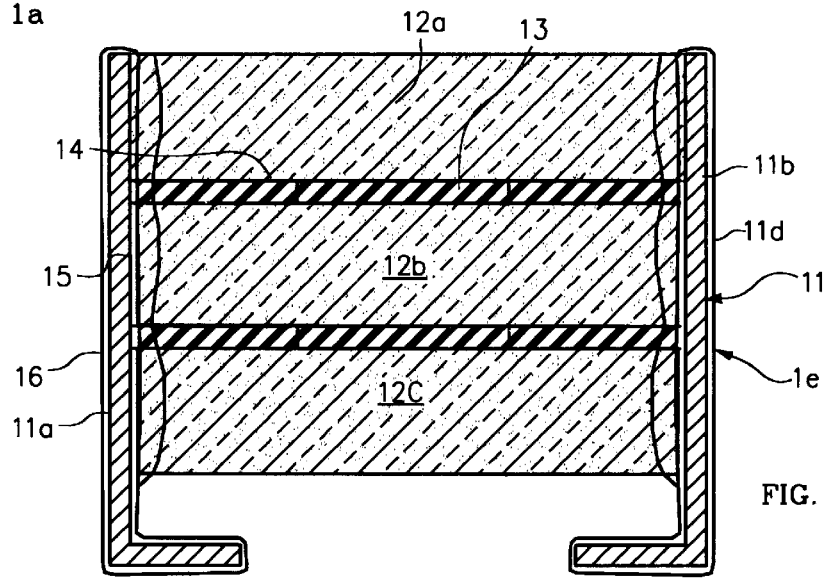
FIG. 2 is a side plan view of a ceramic electronic component, particularly and by way of example a stacked multilayer ceramic capacitor, in accordance with a preferred embodiment of the present invention where the coefficient of thermal expansion (CTE) of the lead frame is at least one-fifth less than the CTE of the ceramic.

A side plan view of a ceramic electronic component, particularly and by way of example a stacked multilayer ceramic capacitor 1c, in accordance with a preferred embodiment of the present invention is shown in FIG. 2. In accordance with the fact that the primary—but not the sole—attribute of the present invention is that the coefficient of thermal expansion (CTE) of the lead frame 11 is less than that of the ceramic 12, and more precisely at least one-fifth less, the diagram of FIG. 2 can be surmised to look much like the prior art, and indeed it does.

Three multi-layer ceramic capacitors 121, 12b, 12c are shown stacked, and connected by a lead frame 11 having left side 11a and right side 11b. In accordance with a subsidiary aspect of the present invention, the capacitors 12a–12c are preferably spaced apart by ceramic spacers 13, and are glassed together with these spaces 13 by glass encapsulant 13, serving as an adhesive, to form a single stack even before the application of the lead frame 11.

The lead frame 11 is so applied by high temperature solder, typically a Sn—Pb solder with a melting temperature greater than 299° C. The lead frame is optionally, preferably, pre-coated with a barrier layer 16, which layer is commonly of copper, nickel, gold or silver, or of combinations or alloys thereof. This layer 16 promotes a quality solder joint.

The ceramic of the capacitors 12 consists essentially of ferrite—which is more common for resistors—or barium titanate—which is more common for capacitors—or combinations thereof. The lead frame 11 consists essentially of a suitable alloy of nickel iron. The nickel iron lead frame 11 is preferably made from the group of nickel iron consisting essentially of alloy 42, Kovar, and Invar, and combinations thereof. Nickel iron alloy 46 is less preferred, but may still meet the CTE criteria of the invention for certain temperature ranges. Nickel iron alloys 48 and 52 are generally unsuitable. (Reference the Table of FIG. 5, discussed hereinafter.)

Figure 3:
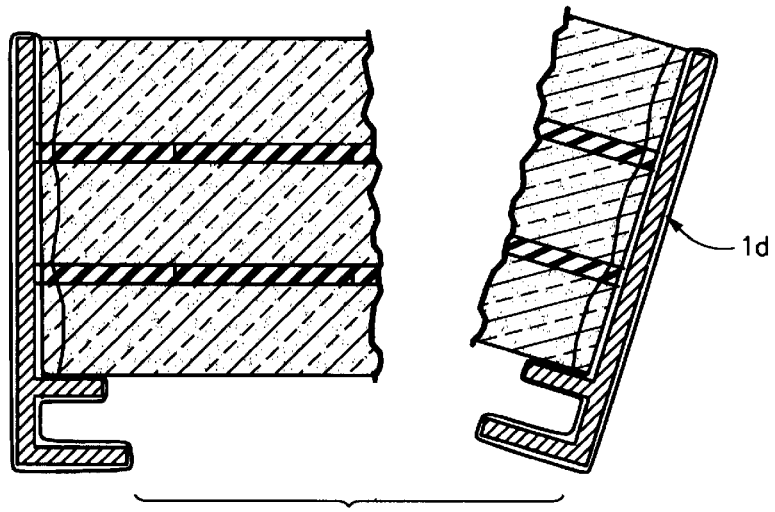
FIG. 3 is diagrammatic side plan view of a thermal failure occurring in a stacked multilayer ceramic capacitor.

A diagrammatic side plan view of a thermal failure occurring in a stacked multilayer ceramic capacitor is shown in FIG. 3. The ceramic has cracked, and a portion has remained connected to each side of the lead frame. This is the primary type of thermally-induced failure that the present invention is directed to preventing.

The advantage of the present invention in promoting resistance to thermally-induced failures resultant from stresses induced by thermal expansion and contractions is especially pronounced in ceramic components, especially stacked capacitors, used in wide temperature range military and space applications. These applications commonly require that stacked capacitors be capable of passing a thermal shock test. The test consists of a number of temperature cycles from −65° C. to +150° C. The selected nickel-iron alloy has a lower CTE than the ceramic capacitors. When the stacked cap is heated the lead frames will expand less than the ceramic which put a compressive stress on the ceramic capacitors. The phosphor-bronze material of the prior art acts in the opposite way. The CTE of phosphor-bronze is higher than the ceramic, so when heated the lead frames put a tensile stress on the ceramic capacitors. Ceramic materials as a whole are much stronger when subjected to compression then when subject to tension. The selected-alloy nickel-iron lead frames of the present invention will not damage the ceramic capacitors: however, the phosphor-bronze lead frames of the prior art can potentially crack the ceramic capacitors.

Figure 4A:
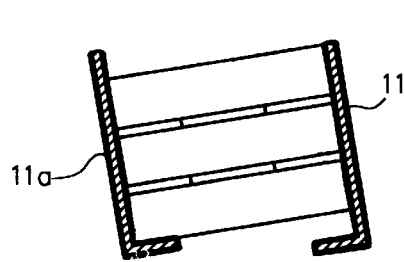
FIGS. 4a and 4b, are diagrammatic side plan views of a dislocations and/or dislodging occurring during the reflow solder mounting of a stacked multilayer ceramic capacitor.
Figure 4B:
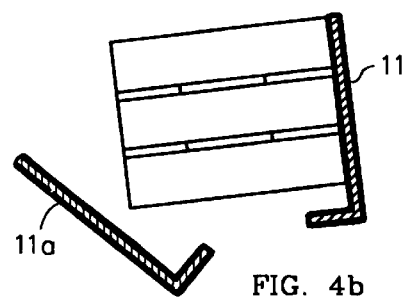

There is, moreover, yet another type of thermal failure. A diagrammatic side plan views of a dislocations and dislodging occurring during the reflow solder mounting of a stacked multilayer ceramic capacitor are shown in FIG. 4, consisting of FIGS. 4a and 4. In FIG. 4a the left side lead frame 11a has become dislocated, and the capacitor if has become catawompus (with no planes parallel). In FIG. 4b the left side lead frame 11a has become dislodged, and the capacitor 1g has split into parts.

The present invention also accords resistance to damage during the presence of soldering heat. This resistance is due spacers 13 and the high temperature solder 15 as well as the nickel-iron lead frame 11.

The use of spacers 13 and high temperature solder 15 combine to give the stacked capacitors 12a–12c very good resistance to soldering heat. Resistance to soldering heat is the ability of the stacked capacitor to maintain mechanical integrity when being reflowed on to a circuit board.

The soldering operation typically has a peak temperature of 210° C. to 220° C. which is much lower than the melting temperature of the high temperature solder 15 used to attach the lead frame 11 to the capacitors 12a–12c. Also, the stack 12 of ceramic capacitors is a single unit so the solder 15 must completely melt from bottom to top before any sagging or other failure takes place as illustrated in FIG. 4.

A prior art table of the typical linear coefficient of thermal expansion for the common nickel-iron alloys in the temperature range of interest is shown in FIG. 5. From this table the alloys suitable to the purposes of the present invention for various temperature ranges may readily be located. Generally, and as has already been stated, a coefficient of thermal expansion of about 5 ppm/°C. is preferred for use with common ceramics in the broad temperature range of −65 °C. to +150° C., which is typical of space-borne applications in earth orbit. This makes nickel iron alloy 42, Kovar, and Invar, and combinations thereof eminently suitable. Nickel iron alloy 46 is less preferred, but,a s may be observed, may still meet the CTE criteria of the invention for temperature ranges in the realm of 30–200–250–300° C. Nickel iron alloys 48 and 52 are not generally suitable (they may sometimes be compounded to suitable alloys).

It should also be understood, for example, that if the spacecraft, with its components and with the leads of these components, is to be used in colder deep space, than the choice of the preferred lead frame nickel-iron alloy might be slightly adjusted.

According to the previous discussion, the method of fabricating ceramic components, normally stacked capacitors, in accordance with the present invention will be recognized to be as follows. Individual capacitors are first assembled into a single, stacked, unit. A ceramic spacer and glass encapsulant is placed between the capacitors. The glass encapsulant acts as a glue to bond the spacers and the capacitors together. Then the lead frames are attached using a high temperature Sn—Pb solder. The lead frame material is a suitable nickel-iron alloy which has an appropriately lower CTE than the ceramic of the capacitors.

This differs from the industry standard construction which is to produce stacked capacitors without spacers. The lead frame then has to serve as the sole support to hold the capacitors in position. Moreover, and most importantly, the lead frame material of the prior art is phosphor-bronze which has about the same CTE as the ceramic capacitors. The lead frame material of the present invention instead has a suitably lower CTE than do the ceramic capacitors.

In accordance with the preceding explanation, variations and adaptations of the lead frames for mounting ceramic electronic parts, particularly ceramic capacitors—where the coefficient of thermal expansion of the lead frame is less than that of the ceramic—in accordance with the present invention will suggest themselves to a practitioner of the electrical component packaging and mounting arts. For example, the ceramic component could be held within a case, or a "can", of nickel-iron alloy, similar to the manner in which a T0-4 case capacitor is held within a metal can, or case.

In accordance with these and other possible variations and adaptations of the present invention, the scope of the invention should be determined in accordance with the following claims, only, and not solely in accordance with that embodiment within which the invention has been taught.

What is claimed is:

1. An electrical device with leads comprising:
   a lead frame, suitable to conduct electricity, having a first coefficient of thermal expansion;
   a solderable surface on the lead frame to which solderable surface electrical connection; and
   a ceramic body having (i) a second coefficient of thermal expansion at least 25% greater than the first coefficient of thermal expansion and (ii) electrically conductive soldered connections to the solderable surface, and thus to the lead frame;
   wherein the electrical device is mounted, and the device's ceramic body electrically connected, by leads of the device's lead frame.

2. The electrical device according to claim 1 wherein the ceramic body is
   a ceramic capacitor.

3. The electrical device according to claim 2 with a plurality of ceramic capacitors connected in electrical parallel, and collectively mounted, by the lead frame.

4. The plural-stacked-capacitor electrical device according to claim 3 further comprising:
   ceramic spacers between the plurality of capacitors that are stacked; and
   a glass encapsulant, acting as an adhesive, between the plurality of stacked capacitors.

5. The electrical device according to claim 2 wherein the ceramic capacitor comprises:
   a multilayer ceramic capacitor.

6. The electrical device according to claim 2 wherein the ceramic capacitor consists essentially of barium titanate.

7. The electrical device according to claim 1 wherein the ceramic body is
   a ceramic inductor.

8. The electrical device according to claim 7 wherein the ceramic inductor consists essentially of ferrite.

9. The electrical device according to claim 1 wherein the ceramic body is:
   a ceramic resistor.

10. The electrical device according to claim 1 wherein the ceramic body consists essentially of ferrite, barium titanate or combinations thereof.

11. The electrical device according to claim 1 wherein the lead frame consists essentially of nickel iron.

12. The electrical device according to claim 1 wherein the solderable surface is made from the group of metals consisting essentially of cooper, nickel, gold, silver and combinations and alloys thereof.

13. The electrical device according to claim 1 wherein the second coefficient of thermal expansion of the ceramic body is at least twice as great as the first coefficient of thermal expansion of the lead frame.

14. The electrical device according to claim 1 wherein the lead frame has pins suitable for insertion in holes.

15. The electrical device according to claim 1 wherein the lead frame has bent feet suitable for surface mounting.

16. An electrical component comprising:
   a nickel-iron lead frame having a first coefficient of thermal expansion;
   a solderable copper surface layer upon and electrically conductive to the lead frame, to which layer electrical connection is made by soldering; and
   a ceramic body, having a second coefficient of thermal expansion at least one-quarter, 25%, larger than the first coefficient of thermal expansion, electrically solder connected to the surface layer, and thus to the lead frame;
   wherein the electrical component may be mounted, and the components ceramic body electrically connected, by leads of the lead frame.

17. A leaded ceramic capacitor comprising:
   a nickel-iron lead frame having a first coefficient of thermal expansion;
   a solderable copper surface layer upon and electrically conductive to the lead frame, to which electrical connection is made by soldering; and
   a ceramic capacitor, having a second coefficient of thermal expansion at least one-quarter, 25%, larger than the first coefficient of thermal expansion, with exposed electrically conductive surfaces solder connected to the surface layer that is upon the lead frame, and thus to the lead frame;
   wherein the ceramic capacitor is mounted, and ceramic capacitor electrically connected, by the leads of the lead frame.

18. An electrical device with leads comprising:
   a lead frame, suitable to conduct electricity, having a first coefficient of thermal expansion;
   a solderable surface on the lead frame to which solderable surface electrical connection is made by soldering; and
   a ceramic body having (i) a second coefficient of thermal expansion and (ii) electrically conductive soldered connections to the solderable surface, and thus to the lead frame;
   wherein the first coefficient of thermal expansion of the lead frame is less than or equal to eighty percent, $\leq 80\%$ of the coefficient of thermal expansion of the ceramic body;
   wherein the electrical device is mounted, and the ceramic body electrically connectable, by leads of the lead frame.

* * * * *